(12) United States Patent
Wang et al.

(10) Patent No.: US 11,760,361 B2
(45) Date of Patent: Sep. 19, 2023

(54) EXTRACTING AGENT INTENT FROM LOG DATA FOR RUNNING LOG-BASED SIMULATIONS FOR EVALUATING AUTONOMOUS VEHICLE SOFTWARE

(71) Applicant: WAYMO LLC, Mountain View, CA (US)

(72) Inventors: Menghui Wang, Santa Clara, CA (US); Aleksandar Gabrovski, Mountain View, CA (US); Xiaoyi Liu, Mountain View, CA (US); Wesley Heung, Mountain View, CA (US); Yang-Hua Chu, Menlo Park, CA (US)

(73) Assignee: Waymo LLC, Mountain View, CA (US)

( * ) Notice: Subject to any disclaimer, the term of this patent is extended or adjusted under 35 U.S.C. 154(b) by 301 days.

(21) Appl. No.: 16/898,528

(22) Filed: Jun. 11, 2020

(65) Prior Publication Data

US 2021/0387628 A1    Dec. 16, 2021

(51) Int. Cl.
*G06F 11/34* (2006.01)
*B60W 40/09* (2012.01)
*B60W 60/00* (2020.01)
*G06F 30/20* (2020.01)

(52) U.S. Cl.
CPC ........ *B60W 40/09* (2013.01); *B60W 60/0025* (2020.02); *G06F 11/3476* (2013.01); *G06F 30/20* (2020.01)

(58) Field of Classification Search
CPC .............................. G06F 30/20; G06F 11/3664
See application file for complete search history.

(56) References Cited

U.S. PATENT DOCUMENTS

| 10,346,564 | B2 | 7/2019 | Kim et al. |
| 10,795,804 | B1 * | 10/2020 | Nygaard ............. G06F 11/3688 |
| 2019/0278698 | A1 | 9/2019 | Ahner et al. |
| 2019/0369637 | A1 * | 12/2019 | Shalev-Shwartz ........................ G01C 21/3492 |

(Continued)

FOREIGN PATENT DOCUMENTS

CN         106153352 A       11/2016

OTHER PUBLICATIONS

Sippl, Christoph, "From Simulation Data to Test Cases for Fully Automated Driving and ADAS", 28th IFIP International Conference on Testing Software and Systems (ICTSS), Oct. 2016, Graz, Austria. pp. 191-206, 10.1007/978-3-319-47443-4_1 2. hal-01643731.

*Primary Examiner* — Duy Khuong T Nguyen
(74) *Attorney, Agent, or Firm* — Botos Churchill IP Law

(57) ABSTRACT

The disclosure relates to running simulations in order to test software used to control a vehicle in an autonomous driving mode. For instance, logged data may be identified for a simulation. The logged data may have been collected by a first vehicle and may identifying an agent that is a road user. The logged data may be analyzed to identify one or more signals of intent of the agent including a logged path of the agent. One or more characteristics may be identified based on the one or more signals. The simulation may be run using the logged data by replacing the agent with an interactive agent having the one or more characteristics. The interactive agent may be capable of responding to actions performed by a simulated vehicle in the simulation using software for controlling a vehicle in an autonomous driving mode.

19 Claims, 10 Drawing Sheets

(56) References Cited

U.S. PATENT DOCUMENTS

2020/0086863 A1* 3/2020 Rosman ............... B60W 30/09
2021/0370972 A1* 12/2021 Bagschik ............ B60W 50/045
2022/0126864 A1* 4/2022 Moustafa ............ B60W 60/001

* cited by examiner

EXTRACTING AGENT INTENT FROM LOG DATA FOR RUNNING LOG-BASED SIMULATIONS FOR EVALUATING AUTONOMOUS VEHICLE SOFTWARE

BACKGROUND

Autonomous vehicles, for instance, vehicles that do not require a human driver, can be used to aid in the transport of passengers or items from one location to another. Such vehicles may operate in a fully autonomous mode where passengers may provide some initial input, such as a pickup or destination location, and the vehicle maneuvers itself to that location, for instance, by determining and following a route which may require the vehicle to respond to and interact with other road users such as vehicles, pedestrians, bicyclists, etc. It is critical that the autonomous control software used by these vehicles to operate in the autonomous mode is tested and validated before such software is actually used to control the vehicles in areas where the vehicles are interacting with other objects.

BRIEF SUMMARY

One aspect of the disclosure provides a method of running a simulation in order to test software used to control a vehicle in an autonomous driving mode. The method includes identifying, by one or more processors, logged data for the simulation, the logged data having been collected by a first vehicle, the logged data further identifying an agent, wherein the agent is a road user; analyzing, by the one or more processors, the logged data to identify one or more signals of intent of the agent including a logged path of the agent; determining, by the one or more processors, one or more characteristics based on the one or more signals; and running, by the one or more processors, the simulation using the logged data by replacing the agent with an interactive agent having the one or more characteristics, wherein the interactive agent is capable of responding to actions performed by a simulated vehicle using the software in the simulation.

In one example, the agent is a vehicle. In another example, the logged path is defined by changes in pose of the agent over a course of the logged data. In another example, the one or more characteristics includes following the logged path. In another example, the one or more signals of intent includes a following distance of the agent. In another example, the one or more characteristics is a following distance for following another agent or the simulated vehicle in the simulation. In another example, the one or more signals of intent includes an overtaking intent of the agent with respect to one of another agent or the first vehicle. In this example, the overtaking intent is determined by observing whether the agent overtook one of the another agent or the first vehicle in the logged data. Alternatively, the overtaking intent is determined from a behavior prediction for the agent during and beyond a period of the logged data. Alternatively, the one or more characteristics includes a characteristic of wanting to overtake another agent or the simulated vehicle in the simulation. In another example, the one or more signals of intent includes a cut-in aggressiveness of the agent with respect to the first vehicle. In this example, the cut-in aggressiveness of the agent is determined by comparing the logged path to a route the first vehicle was following in the logged data. In addition, the cut-in aggressiveness of the agent is determined based on whether the logged path overlaps with the route. In addition or alternatively, the method also includes, when the logged path overlaps with the route, determining a minimum braking amount required for the first vehicle to avoid a collision with the agent. In this example, determining the one or more characteristics is further based on the minimum braking amount. In another example, the one or more signals of intent include an intent of the agent to go off-road. In another example, the one or more signals includes whether the agent intended to run a red light, and the one or more characteristics includes a characteristic of running a red light. In another example, the one or more signals of intent include a maximum velocity of the agent, and the one or more characteristics includes the maximum velocity as a limit on a velocity of the interactive agent. In another example, the one or more signals of intent include the maximum acceleration of the agent, and the one or more characteristics includes the maximum acceleration as a limit on acceleration of the interactive agent. In another example, the method also includes evaluating results of running the simulation and flagging the simulation for review based on the evaluation.

DETAILED DESCRIPTION

Overview

Figure 1:
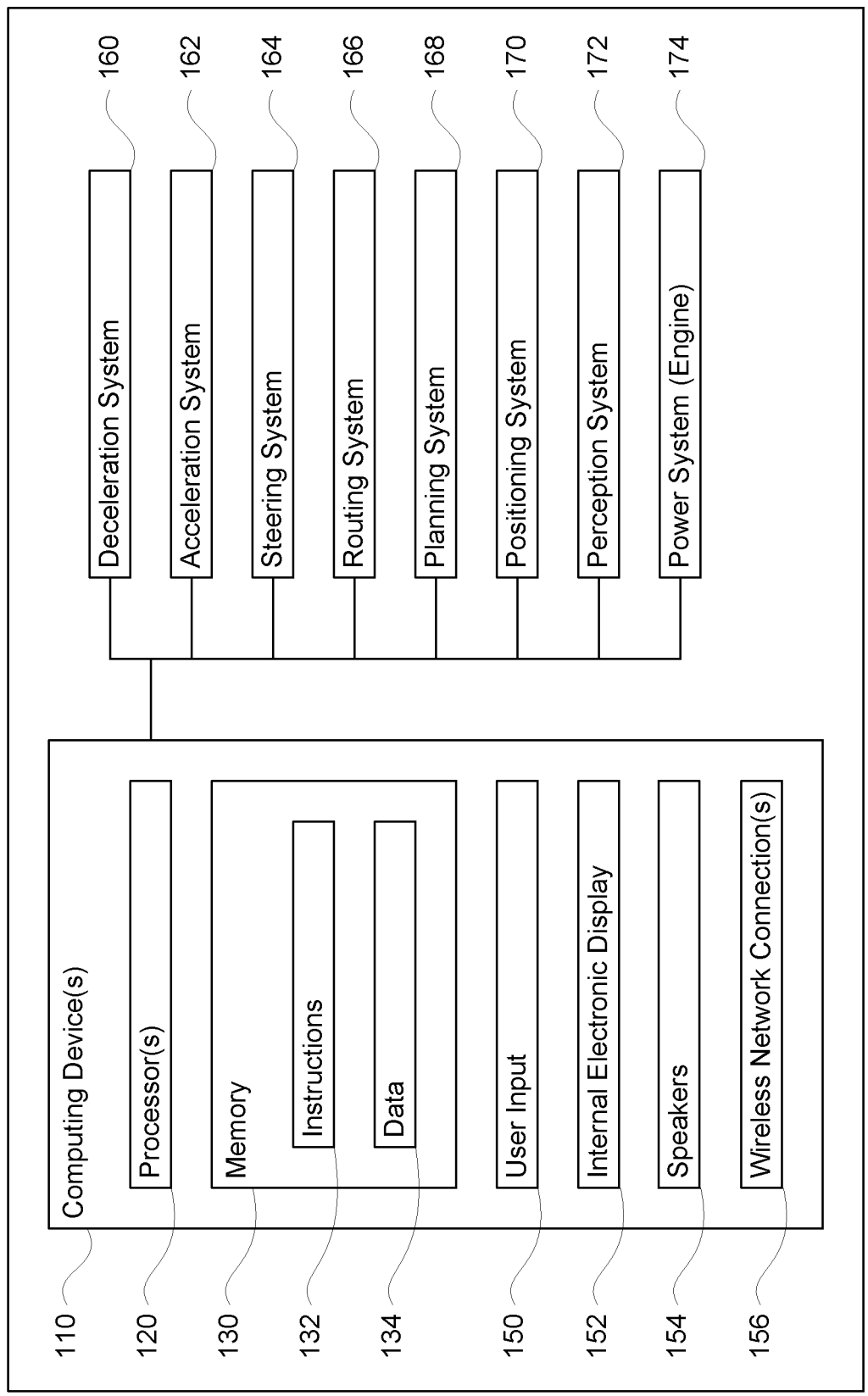
FIG. 1 is a functional diagram of an example vehicle in accordance with aspects of the disclosure.

The technology relates to testing software used to control vehicles in an autonomous driving mode using log-based simulations. The log-based simulations correspond to simulations which are run using logged data collected by a vehicle operating in an autonomous driving mode over some brief period of time such as 1 minute or more or less. The logged data may include information from the vehicle's various systems including perception, routing, planning, positioning, etc. At the same time, the actual vehicle is replaced with a virtual autonomous vehicle or a simulated vehicle which can make decisions using software for controlling the vehicle autonomously. By doing so, the software can be rigorously tested and evaluated.

However, when running simulations using logged data, changing the behavior of the autonomous vehicle, such as by testing a different software version than that used to log the logged data, can cause unintended consequences. For instance, after only a few seconds of a minute-long simulation, the simulated vehicle may diverge in its behavior so much that the purpose of the simulation, to test reaction of the software to a specific situation, is lost because the situation is no longer achievable. This may occur because the agents (or other road users defined in the logged data) in the simulation may interfere with the simulated vehicle, for instance, colliding with the simulated vehicle because those agents are behaving as they were observed doing so in the logged data. Typically, if the simulation results in a particular type of event, such as a particular type of behavior of the simulated vehicle and/or the simulated vehicle colliding with an agent or other object of the logged data, then the simulation may be flagged for review by an operator. Thus, such interactions can result in false positives.

To address these issues, agents in the logged data (i.e. other road users) may be replaced by a simulated road user in order to more realistically interact with a virtual vehicle in a simulation. However, replacing an agent with an idealized interactive agent may in some instances result in changing the dynamics of a particular simulation. In other words, while the interactive agents may be initialized in a simulation with the speed, acceleration/deceleration, and pose (location and orientation) of the agent as defined in the logged data, the interactive agent would not have the specific "intent" of that agent. For instance, in a scenario which would test the response of the autonomous vehicle software to another vehicle behaving aggressively or even recklessly, if the agent is replaced with an interactive agent that behaves like an idealized human driver, simulation itself would lose its usefulness. However, simply "dialing" up the aggressiveness of an interactive agent may also result in the simulation becoming unrealistic as the interactive agent may again no longer respond as the agent in the simulation.

In order to determine what characteristics the interactive agent should have, the logged data may be analyzed before running the simulation in order to extract a number of signals that describe the intent and persona of each agent in the log. In this regard, each agent identified in the log, whether or not that agent interacted with the vehicle that captured the logged data, may be replaced with an interactive agent appropriate for that agent's intent and persona as defined in the log.

One example signal may include the logged path of the agent. Another example signal may include the following distance of the agent. Another example signal may include the overtaking intent of the agent or whether the agent intends to overtake another road user (which may or may not be the simulated vehicle) in the logged data. Another example signal may include the cut-in aggressiveness of the agent or whether the agent intends to cut-in or move into a lane directly front of the vehicle that captured the logged data and if so, how aggressively. Another example signal may include whether the driver intended to go off-road. Another example signal may include the traffic light intent of the agent or whether the agent intends to run a red light. Another example signal may include the agent's maximum velocity and/or acceleration relative to the speed limit.

For each signal determined for an agent, one or more characteristics may be identified and used to generate an interactive agent to replace the agent. A simulation may then be run using the logged data and the interactive agent, as well as other interactive agents with respective characteristics, replacing any agents in the logged data. The results of the simulation may then be evaluated as noted above.

The features described herein may provide for more accurate simulations when testing software for controlling vehicles in an autonomous driving mode. In other words, agents can be replaced with interactive agents which can respond to their environment while at the same time, preserving the scenario defined in the logged data used to run the simulation. For instance, if the logged data provides a scenario which tests an interaction with a reckless driver, the features described herein enable the preservation of the reckless behavior of the driver to be preserved. In addition, the features allow for the modeling of uncommon behavior, such as, for example, a cyclist who gets off his or her bicycle and lifts the bicycle to walk on a sidewalk.

EXAMPLE SYSTEMS

As shown in FIG. 1, a vehicle 100 in accordance with one aspect of the disclosure includes various components. While certain aspects of the disclosure are particularly useful in connection with specific types of vehicles, the vehicle may be any type of vehicle including, but not limited to, cars, trucks, motorcycles, buses, recreational vehicles, etc. The vehicle may have one or more computing devices, such as computing devices 110 containing one or more processors 120, memory 130 and other components typically present in general purpose computing devices.

The memory 130 stores information accessible by the one or more processors 120, including instructions 134 and data 132 that may be executed or otherwise used by the processor 120. The memory 130 may be of any type capable of storing information accessible by the processor, including a computing device-readable medium, or other medium that stores data that may be read with the aid of an electronic device, such as a hard-drive, memory card, ROM, RAM, DVD or other optical disks, as well as other write-capable and read-only memories. Systems and methods may include different combinations of the foregoing, whereby different portions of the instructions and data are stored on different types of media.

The instructions 134 may be any set of instructions to be executed directly (such as machine code) or indirectly (such as scripts) by the processor. For example, the instructions may be stored as computing device code on the computing device-readable medium. In that regard, the terms "software," "instructions" and "programs" may be used interchangeably herein. The instructions may be stored in object code format for direct processing by the processor, or in any other computing device language including scripts or collections of independent source code modules that are interpreted on demand or compiled in advance. Functions, methods and routines of the instructions are explained in more detail below.

The data 132 may be retrieved, stored or modified by processor 120 in accordance with the instructions 134. For instance, although the claimed subject matter is not limited by any particular data structure, the data may be stored in computing device registers, in a relational database as a table having a plurality of different fields and records, XML documents or flat files. The data may also be formatted in any computing device-readable format.

The one or more processors 120 may be any conventional processors, such as commercially available CPUs. Alternatively, the one or more processors may be a dedicated device such as an ASIC or other hardware-based processor. Although FIG. 1 functionally illustrates the processor, memory, and other elements of computing devices 110 as being within the same block, it will be understood by those of ordinary skill in the art that the processor, computing device, or memory may actually include multiple processors, computing devices, or memories that may or may not be stored within the same physical housing. For example, memory may be a hard drive or other storage media located in a housing different from that of computing devices 110. Accordingly, references to a processor or computing device will be understood to include references to a collection of processors or computing devices or memories that may or may not operate in parallel.

Computing devices 110 may all of the components normally used in connection with a computing device such as the processor and memory described above as well as a user input 150 (e.g., a mouse, keyboard, touch screen and/or microphone) and various electronic displays (e.g., a monitor having a screen or any other electrical device that is operable to display information). In this example, the vehicle includes an internal electronic display 152 as well as one or more speakers 154 to provide information or audio visual experiences. In this regard, internal electronic display 152 may be located within a cabin of vehicle 100 and may be used by computing devices 110 to provide information to passengers within the vehicle 100.

Computing devices 110 may also include one or more wireless network connections 156 to facilitate communication with other computing devices, such as the client computing devices and server computing devices described in detail below. The wireless network connections may include short range communication protocols such as Bluetooth, Bluetooth low energy (LE), cellular connections, as well as various configurations and protocols including the Internet, World Wide Web, intranets, virtual private networks, wide area networks, local networks, private networks using communication protocols proprietary to one or more companies, Ethernet, WiFi and HTTP, and various combinations of the foregoing.

In one example, computing devices 110 may be control computing devices of an autonomous driving computing system or incorporated into vehicle 100. The autonomous driving computing system may be capable of communicating with various components of the vehicle in order to control the movement of vehicle 100 according to the autonomous control software of memory 130 as discussed further below. For example, returning to FIG. 1, computing devices 110 may be in communication with various systems of vehicle 100, such as deceleration system 160, acceleration system 162, steering system 164, routing system 166, planning system 168, positioning system 170, perception system 172, and power system 174 (i.e. the vehicle's engine or motor) in order to control the movement, speed, etc. of vehicle 100 in accordance with the instructions 134 of memory 130. Again, although these systems are shown as external to computing devices 110, in actuality, these systems may also be incorporated into computing devices 110, again as an autonomous driving computing system for controlling vehicle 100.

As an example, computing devices 110 may interact with one or more actuators of the deceleration system 160 and/or acceleration system 162, such as brakes, accelerator pedal, and/or the engine or motor of the vehicle, in order to control the speed of the vehicle. Similarly, one or more actuators of the steering system 164, such as a steering wheel, steering shaft, and/or pinion and rack in a rack and pinion system, may be used by computing devices 110 in order to control the direction of vehicle 100. For example, if vehicle 100 is configured for use on a road, such as a car or truck, the steering system may include one or more actuators to control the angle of wheels to turn the vehicle.

Routing system 166 and planning system 168 may be used by computing devices 110 in order to determine and follow a route to a location. In this regard, the routing system 168 and/or data 132 may store detailed map information, e.g., highly detailed maps identifying the shape and elevation of roadways, lane lines, intersections, crosswalks, speed limits, traffic signal lights, buildings, signs, real time traffic information, vegetation, or other such objects and information.

Figure 2:
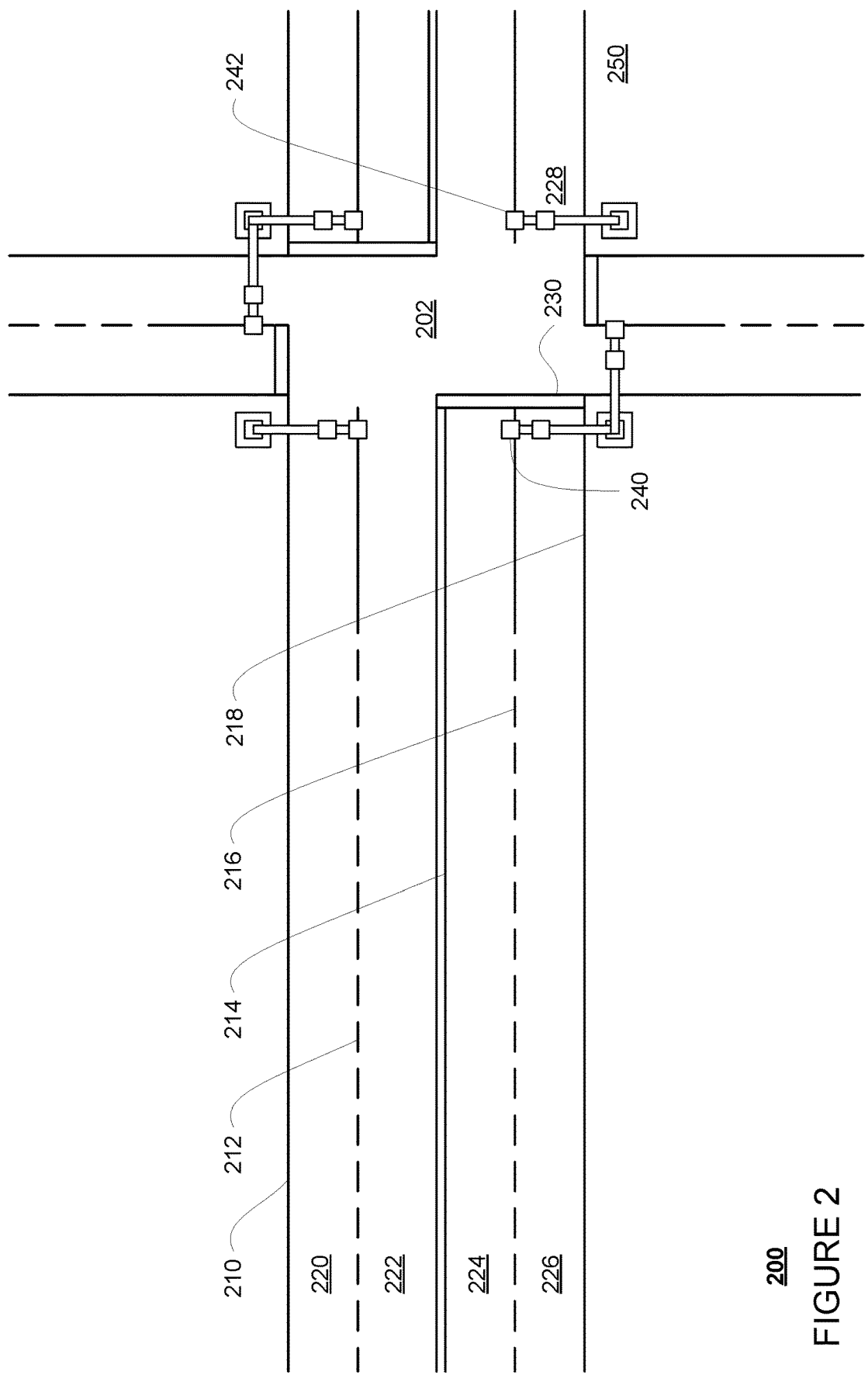
FIG. 2 is an example of map information in accordance with aspects of the disclosure.

FIG. 2 is an example of map information 200 for a section of roadway including an intersection 202. In this example, the map information 200 includes information identifying the shape, location, and other characteristics of lane lines 210, 212, 214, 216, 218 which define the shape and location of lanes, such as lanes 220, 222, 224, 226, 228. The map information also identifies other features of intersection 202 such as stop line 230 and traffic signal lights 240, 242 which control traffic in lanes 224, 226. In this example, the map information also identifies "off-road" areas or areas that are outside of the drivable areas of the map information, such as off-road area 250. The map information may also include other details and features not depicted in this example.

Although the map information is depicted herein as an image-based map, the map information need not be entirely image based (for example, raster). For example, the map information may include one or more roadgraphs or graph networks of information such as roads, lanes, intersections, and the connections between these features. Each feature may be stored as graph data and may be associated with information such as a geographic location and whether or not it is linked to other related features, for example, as noted above, traffic signal lights 240, 242 may be linked to lanes 224, 226, a stop sign may be linked to a road and an intersection, etc. In some examples, the associated data may include grid-based indices of a roadgraph to allow for efficient lookup of certain roadgraph features.

Positioning system 170 may be used by computing devices 110 in order to determine the vehicle's relative or absolute position on a map or on the earth. For example, the positioning system 170 may include a GPS receiver to determine the device's latitude, longitude and/or altitude position. Other location systems such as laser-based localization systems, inertial-aided GPS, or camera-based localization may also be used to identify the location of the vehicle. The location of the vehicle may include an absolute geographical location, such as latitude, longitude, and altitude as well as relative location information, such as location relative to other cars immediately around it which can often be determined with less noise that absolute geographical location.

The positioning system 170 may also include other devices in communication with computing devices 110, such as an accelerometer, gyroscope or another direction/speed detection device to determine the direction and speed of the vehicle or changes thereto. By way of example only, an acceleration device may determine its pitch, yaw or roll (or changes thereto) relative to the direction of gravity or a plane perpendicular thereto. The device may also track increases or decreases in speed and the direction of such changes. The device's provision of location and orientation data as set forth herein may be provided automatically to the computing devices 110, other computing devices and combinations of the foregoing.

Figure 3:
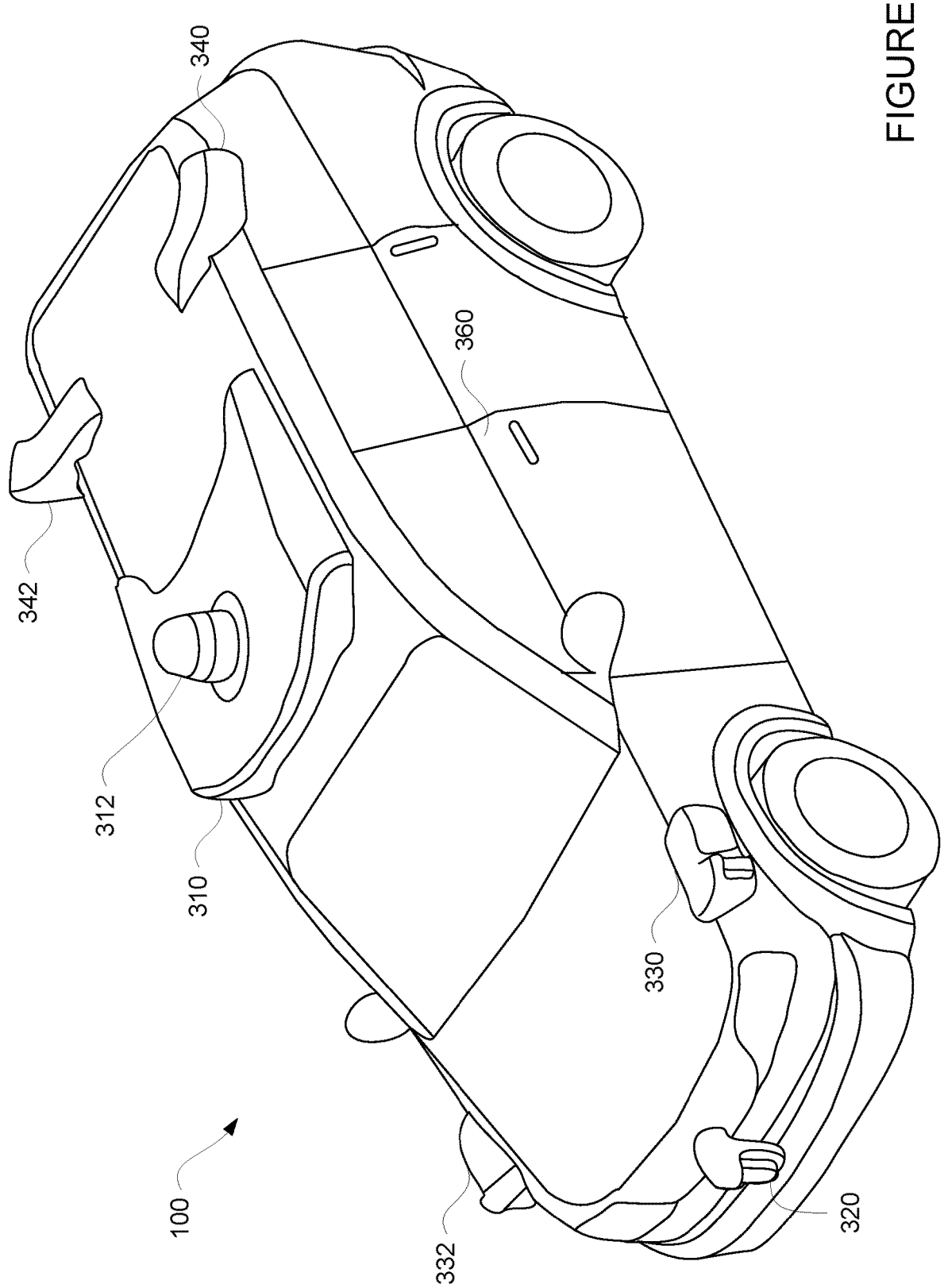
FIG. 3 is an example external view of a vehicle in accordance with aspects of the disclosure.

The perception system 172 also includes one or more components for detecting objects external to the vehicle such as other vehicles, obstacles in the roadway, traffic signal lights, signs, trees, etc. For example, the perception system 172 may include lasers, sonar, radar, cameras and/or any other detection devices that record data which may be processed by computing device 110. In the case where the vehicle is a passenger vehicle such as a minivan, the minivan may include a laser or other sensors mounted on the roof or other convenient location. For instance, FIG. 3 is an example external view of vehicle 100. In this example, roof-top housing 310 and dome housing 312 may include a LIDAR sensor as well as various cameras and radar units. In addition, housing 320 located at the front end of vehicle 100 and housings 330, 332 on the driver's and passenger's sides of the vehicle may each store a LIDAR sensor. For example, housing 330 is located in front of driver door 360. Vehicle 100 also includes housings 340, 342 for radar units and/or cameras also located on the roof of vehicle 100. Additional radar units and cameras (not shown) may be located at the front and rear ends of vehicle 100 and/or on other positions along the roof or roof-top housing 310.

The computing devices 110 may control the direction and speed of the vehicle by controlling various components. By way of example, computing devices 110 may navigate the vehicle to a destination location completely autonomously using data from the detailed map information, routing system 166, and planning system 168. Computing devices 110 may use the positioning system 170 to determine the vehicle's location and perception system 172 to detect and respond to objects when needed to reach the location safely. In order to do so, computing devices 110 may cause the vehicle to accelerate (e.g., by increasing fuel or other energy provided to the engine by acceleration system 162), decelerate (e.g., by decreasing the fuel supplied to the engine, changing gears, and/or by applying brakes by deceleration system 160), change direction (e.g., by turning the front or rear wheels of vehicle 100 by steering system 164), and signal such changes (e.g., by lighting turn signals of signaling system 166). Thus, the acceleration system 162 and deceleration system 160 may be a part of a drivetrain that includes various components between an engine of the vehicle and the wheels of the vehicle. Again, by controlling these systems, computing devices 110 may also control the drivetrain of the vehicle in order to maneuver the vehicle autonomously.

Figure 4:
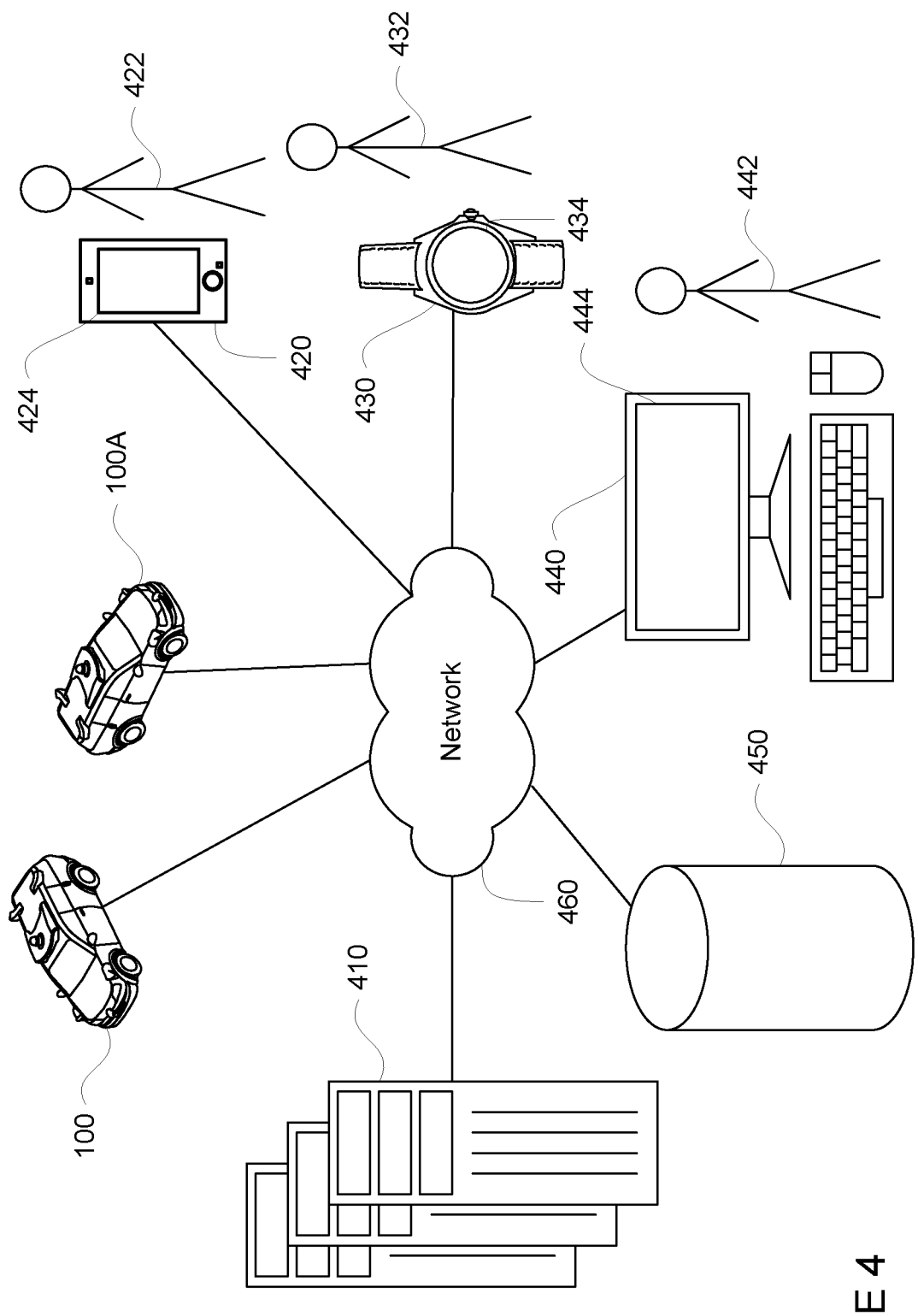
FIG. 4 is a pictorial diagram of an example system in accordance with aspects of the disclosure.
Figure 5:
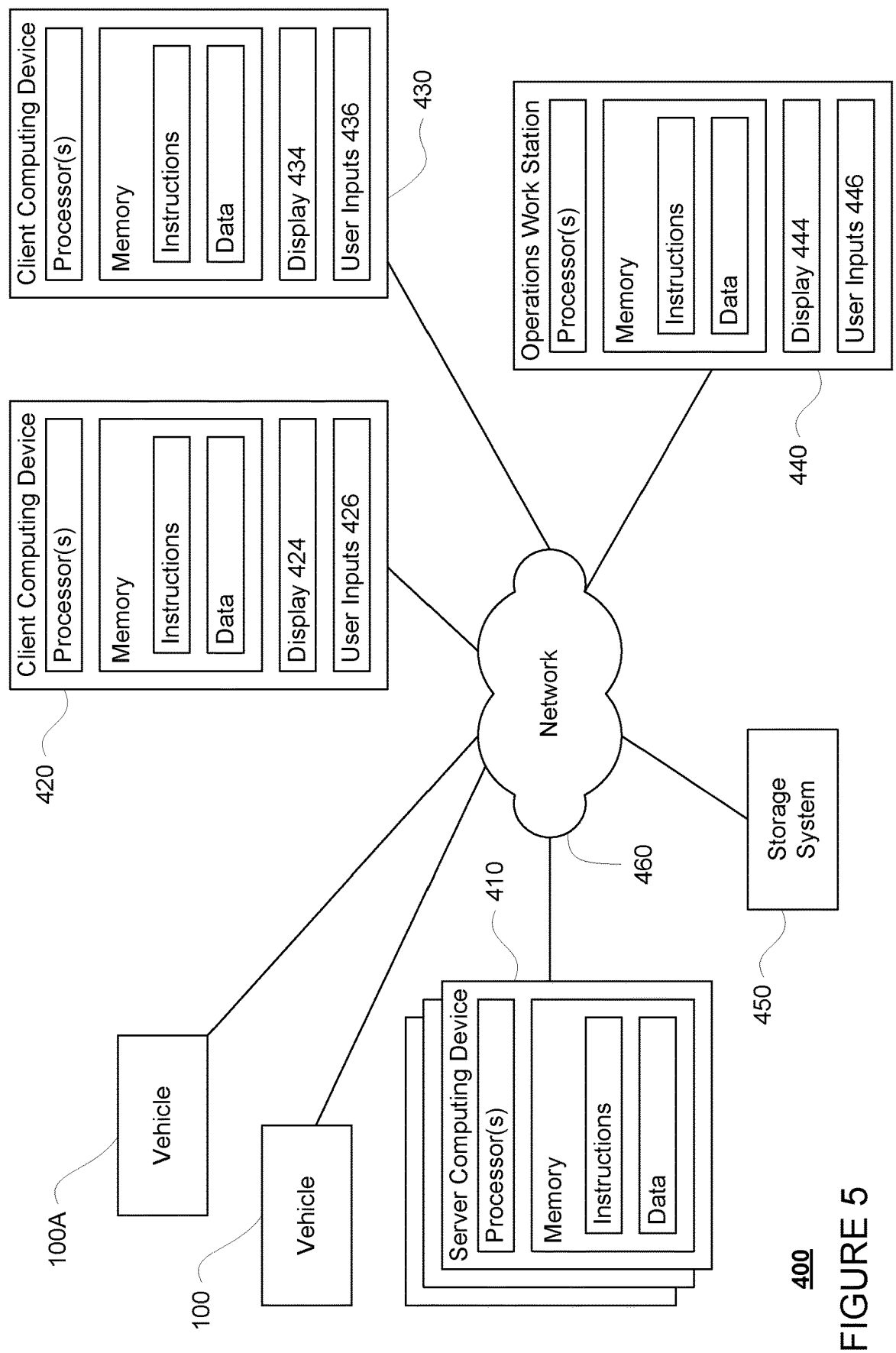
FIG. 5 is a functional diagram of the system of FIG. 4 in accordance with aspects of the disclosure.

Computing device 110 of vehicle 100 may also receive or transfer information to and from other computing devices, such as those computing devices that are a part of the transportation service as well as other computing devices. FIGS. 4 and 5 are pictorial and functional diagrams, respectively, of an example system 400 that includes a plurality of computing devices 410, 420, 430, 440 and a storage system 450 connected via a network 460. System 400 also includes vehicle 100 and vehicle 100A which may be configured the same as or similarly to vehicle 100. Although only a few vehicles and computing devices are depicted for simplicity, a typical system may include significantly more.

As shown in FIG. 4, each of computing devices 410, 420, 430, 440 may include one or more processors, memory, data and instructions. Such processors, memories, data and instructions may be configured similarly to one or more processors 120, memory 130, data 132, and instructions 134 of computing device 110.

The network 460, and intervening nodes, may include various configurations and protocols including short range communication protocols such as Bluetooth, Bluetooth LE, the Internet, World Wide Web, intranets, virtual private networks, wide area networks, local networks, private networks using communication protocols proprietary to one or more companies, Ethernet, WiFi and HTTP, and various combinations of the foregoing. Such communication may be facilitated by any device capable of transmitting data to and from other computing devices, such as modems and wireless interfaces.

In one example, one or more computing devices 410 may include one or more server computing devices having a plurality of computing devices, e.g., a load balanced server farm, that exchange information with different nodes of a network for the purpose of receiving, processing and transmitting the data to and from other computing devices. For instance, one or more computing devices 410 may include one or more server computing devices that are capable of communicating with computing device 110 of vehicle 100 or a similar computing device of vehicle 100A as well as computing devices 420, 430, 440 via the network 460. For example, vehicles 100, 100A, may be a part of a fleet of vehicles that can be dispatched by server computing devices to various locations. In this regard, the server computing devices 410 may function as a validation computing system which can be used to validate autonomous control software which vehicles such as vehicle 100 and vehicle 100A may use to operate in an autonomous driving mode. In addition, server computing devices 410 may use network 460 to transmit and present information to a user, such as user 422, 432, 442 on a display, such as displays 424, 434, 444 of computing devices 420, 430, 440. In this regard, computing devices 420, 430, 440 may be considered client computing devices.

As shown in FIG. 4, each client computing device 420, 430, 440 may be a personal computing device intended for use by a user 422, 432, 442, and have all of the components normally used in connection with a personal computing device including a one or more processors (e.g., a central processing unit (CPU)), memory (e.g., RAM and internal hard drives) storing data and instructions, a display such as displays 424, 434, 444 (e.g., a monitor having a screen, a touch-screen, a projector, a television, or other device that is operable to display information), and user input devices 426, 436, 446 (e.g., a mouse, keyboard, touchscreen or microphone). The client computing devices may also include a camera for recording video streams, speakers, a network interface device, and all of the components used for connecting these elements to one another.

Although the client computing devices 420, 430, and 440 may each comprise a full-sized personal computing device, they may alternatively comprise mobile computing devices capable of wirelessly exchanging data with a server over a network such as the Internet. By way of example only, client computing device 420 may be a mobile phone or a device such as a wireless-enabled PDA, a tablet PC, a wearable computing device or system, or a netbook that is capable of obtaining information via the Internet or other networks. In another example, client computing device 430 may be a wearable computing system, shown as a wristwatch as shown in FIG. 4. As an example the user may input information using a small keyboard, a keypad, microphone, using visual signals with a camera, or a touch screen.

In some examples, client computing device 440 may be an operations workstation used by an administrator or operator to review scenario outcomes, handover times, and validation information as discussed further below. Although only a single operations workstation 440 is shown in FIGS. 4 and 5, any number of such work stations may be included in a typical system. Moreover, although operations work station is depicted as a desktop computer, operations workstations may include various types of personal computing devices such as laptops, netbooks, tablet computers, etc.

As with memory 130, storage system 450 can be of any type of computerized storage capable of storing information accessible by the server computing devices 410, such as a hard-drive, memory card, ROM, RAM, DVD, CD-ROM, write-capable, and read-only memories. In addition, storage system 450 may include a distributed storage system where data is stored on a plurality of different storage devices which may be physically located at the same or different geographic locations. Storage system 450 may be connected to the computing devices via the network 460 as shown in FIGS. 4 and 5, and/or may be directly connected to or incorporated into any of the computing devices 110, 410, 420, 430, 440, etc.

Storage system 450 may store various types of information as described in more detail below. This information may be retrieved or otherwise accessed by a server computing device, such as one or more server computing devices 410, in order to perform some or all of the features described herein. For instance, storage system 450 may store logged data. This logged data may include, for instance, sensor data generated by a perception system, such as perception system 172 of vehicle 100. As an example, the sensor data may include raw sensor data as well as data identifying defining characteristics of perceived objects such as shape, location, orientation, speed, etc. of objects such as vehicles, pedestrians, bicyclists, vegetation, curbs, lane lines, sidewalks, crosswalks, buildings, etc. The logged data may also include "event" data identifying different types of events such as collisions or near collisions with other objects, planned trajectories describing a planned geometry and/or speed for a potential path of the vehicle 100, 100A, actual locations of the vehicles at different times, actual orientations/headings of the vehicle at different times, actual speeds, accelerations and decelerations of the vehicle at different times, classifications of and responses to perceived objects, behavior predictions of perceived objects, status of various systems (such as acceleration, deceleration, perception, steering, signaling, routing, power, etc.) of the vehicle at different times including logged errors, inputs to and outputs of the various systems of the vehicle at different times, etc. As such, these events and the sensor data may be used to "recreate" the vehicle's environment, including perceived objects, and behavior of a vehicle in a simulation. In some instances, the logged data may be annotated with information identifying behaviors of the autonomous vehicle, such as passing, changing lanes, merging, etc., as well as with information identifying behaviors of other agents in the logged data, such as passing or overtaking the autonomous vehicle, changing lanes, merging, etc.

The storage system may also store interactive agents, or data and instructions that can be used to generate a simulated road user in order to interact with a virtual vehicle in a simulation. Because there are different types of road users, there may be different types of interactive agents. For instance, there may be interactive agents for vehicles (or to specific types of vehicles), such as an autonomous vehicle, bus, van, small car, truck, motorcycle, emergency vehicles (e.g. police car, ambulance, etc.), and other larger vehicles as well as non-vehicles such as pedestrians, crowds of pedestrian, pedestrians with strollers, children, scooters, wild animals and pets, etc.

Because humans are generally unpredictable, the interactive agents may be generated by establishing a set of characteristics. Typically, these characteristics may relate to the reaction times, for instance for reacting to visual or audible stimuli by moving a foot or a hand to change braking, acceleration, and/or steering behaviors of a vehicle as with a human driver, pedestrian, bicyclist. In other words, the interactive agents may include models for how an ideal, average, or below average human would brake or swerve which are available from existing human reaction research. In this regard, the models may be approximate and hand tuned, and likely to respond in more predictable ways than typical human drivers. In some instances, the models may also have behavioral rules, such as how a typical driver would behave at a 4-way stop or respond to a child in the environment, etc. However, such modeling may essentially ignore the intent and personal of the original agent from the logged data.

In addition, the storage system 450 may also store autonomous control software which is to be used by vehicles, such as vehicle 100, to operate a vehicle in an autonomous driving mode. This autonomous control software stored in the storage system 450 may be a version which has not yet been tested or validated. Once validated, the autonomous control software may be sent, for instance, to memory 130 of vehicle 100 in order to be used by computing devices 110 to control vehicle 100 in an autonomous driving mode.

EXAMPLE METHODS

In addition to the operations described above and illustrated in the figures, various operations will now be described. It should be understood that the following operations do not have to be performed in the precise order described below. Rather, various steps can be handled in a different order or simultaneously, and steps may also be added or omitted.

Figure 10:
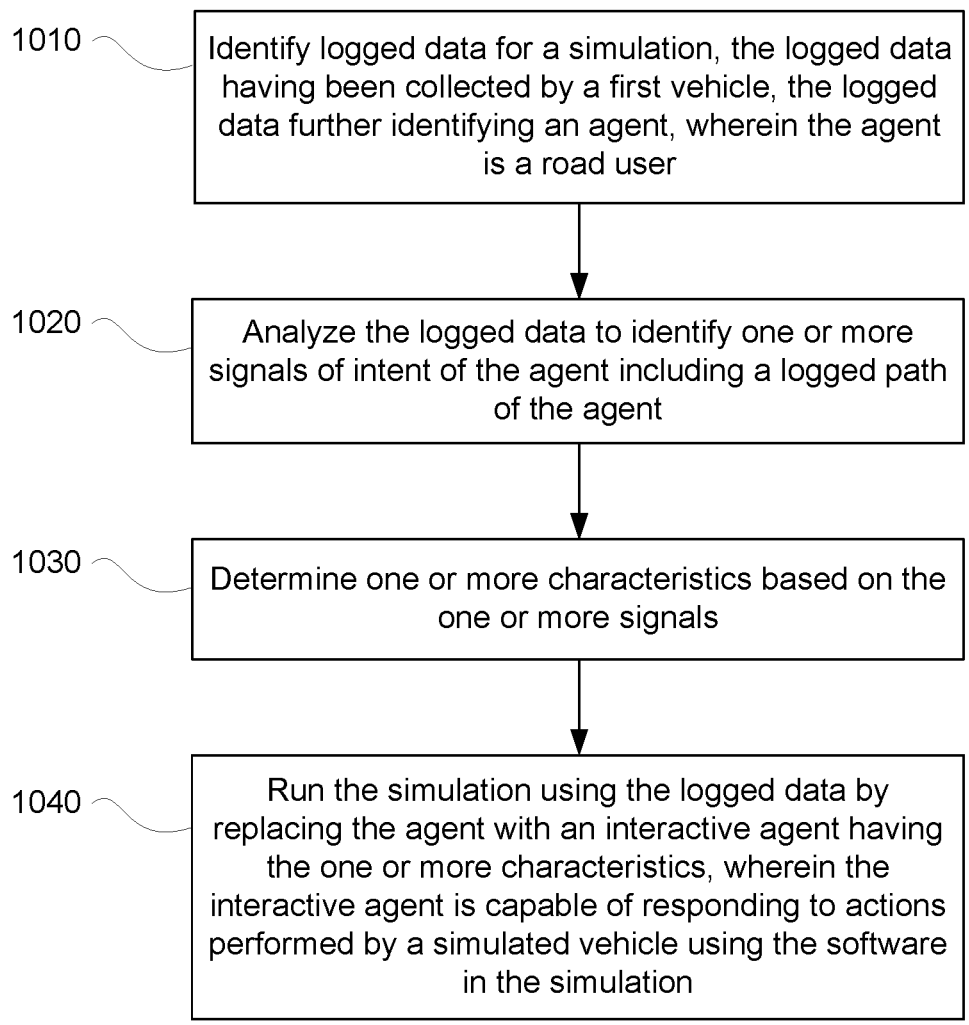
FIG. 10 is an example flow diagram in accordance with aspects of the disclosure.

FIG. 10 includes an example flow diagram 1000 of some of the examples for running a simulation in order to test software used to control a vehicle in an autonomous driving mode, which may be performed by one or more processors such as the processors of server computing devices 410. For instance, at block 1010, logged data for a simulation is identified. This logged data being collected by a first vehicle and identifying an agent that is a road user. In order to evaluate the autonomous control software which will be stored in memory 130 for use by the computing devices 110 of vehicle 100, the server computing devices 410 may run various simulations. These simulations may be log-based simulations that are generated from the information stored in the aforementioned logged data of storage system 450. In this regard, the server computing devices 410 may access the storage system 450 in order to retrieve the logged data and run a simulation. For instance, a portion of the logged data corresponding to a minute in real time of an autonomous vehicle that generated the logged data may be retrieved from the storage system by the server computing devices 410. This portion of logged data may be "hand" selected by human operators and/or computing devices based on the types of events recorded in the logs or more randomly, for instance, by selecting 1% or more or less of all autonomous driving logs.

Turning to FIGS. 6-9 provide an example of logged data 600 for a section of roadway corresponding to the map information 200. In this example, the shape, location and other characteristics of intersection 602 may correspond to the shape, location of other characteristics of an intersection 202. Similarly, lane lines 610, 612, 614, 616, 618 may correspond to lane lines 210, 212, 214, 216, 218, lanes 620, 622, 624, 626, 628 correspond to lanes 220, 222, 224, 226, 228, stop line 630 corresponds to stop line 230, traffic signal lights 640, 642 correspond to traffic signal lights 240, 242 and off-road area 650 corresponds to off-road area 250. The logged data also includes agents including agent vehicles 660, 670, 680 as well as a representation of vehicle 100 which captured the logged data. These agents represent other road users that are detected by the perception system 172 of the vehicle 100.

In this example, time in the logged data progresses forward from FIG. 6 to FIG. 7 to FIG. 8 to FIG. 9. In this example, the vehicle 100 approaches intersection 602 from lane 626 and stops at the stop line 630. The agent vehicle 660 is initially behind vehicle 100 in lane 626, moves into lane 624, passes or overtakes vehicle 100, cuts-in in front of vehicle 100 by moving back into lane 626, passes or overtakes agent vehicle 670, enters the intersection 602 without stopping at the stop line 630, and continues into lane 628. The agent vehicle 670 starts in lane 624 and stops at the stop line 630. The agent vehicle 680 starts in lane 626, enters the intersection 602 without stopping at the stop line 630, continues into lane 628, and enters into off-road area 650.

Returning to FIG. 10, at block 1020 the logged data is analyzed to identify one or more signals of intent of the agent including a logged path of the agent. Thereafter, at block 1030, one or more characteristics are determined based on the one or more signals. In order to determine what characteristics an interactive agent should be given for a simulation, the logged data may be analyzed by the server computing devices 410 before running the simulation in order to extract a number of signals that describe the intent and persona of each agent in the log. In this regard, each agent identified in the log, whether or not that agent interacted with the vehicle that captured the logged data, may be replaced with an interactive agent appropriate for that agent's intent and persona as defined in the log.

One example signal may include the logged path of the agent. This logged path may be defined by the changes in the pose of the agent over the course of the logged data, or rather, at any point in the logged data. This logged path may thus suggest the intent of the agent and may be the strongest signal of the agent's intent. For example, the logged path of agent vehicle 660 includes moving from lane 626 to lane 624, moving from lane 624 back into lane 626, entering the intersection 602, and continuing into lane 628. The logged path of agent vehicle 670 includes starting in lane 624 and continuing towards intersection 602. The logged path of agent vehicle 680 includes starting in lane 626, entering the intersection 602, continuing into lane 628, and entering into off-road area 650.

In this regard, the interactive agent may be given, by the server computing devices 410, the characteristic that the interactive agent will attempt to follow the logged path during the simulation. For example, the interactive agent which replaces agent vehicle 660 will start in lane 626 and attempt to move from lane 626 to lane 624, move from lane 624 back into lane 626, enter the intersection 602, and continue into lane 628. The interactive agent which replaces agent vehicle 670 will start in lane 624 and attempt to continue towards intersection 602. The interactive agent which replaces agent vehicle 680 will start in lane 624 and attempt to enter the intersection 602, continue into lane 628, and enter into off-road area 650.

In order to enable the interactive agent to both follow and deviate from the logged path, a cost function that balances the divergence from the logged path with other factors such as collision avoidance and smooth driving may be used. In this regard, the server computing devices 410 may choose a behavior or characteristic for an interactive agent that minimizes the value of this cost function. In other words, as noted above, each interactive agent will attempt to follow the logged path during a simulation, but may be allowed to deviate from the logged path if needed in order to respond to other agents and a simulated vehicle in order to make the simulation more realistic.

Another example signal may include the following distance of the agent. The following distance may suggest whether the agent is an aggressive tailgater or a normal, non-tailgating agent. In this regard, the following distance may be analyzed as a continuous signal where the minimum following distance exhibited by the agent in the logged data is determined. During the simulation, a penalty may be imposed by way of a cost function when the agent gets closer than this minimum following distance. In this regard, an aggressive tailgater will not or will be penalized less than any other agent for keeping the same following distance.

Figure 6:
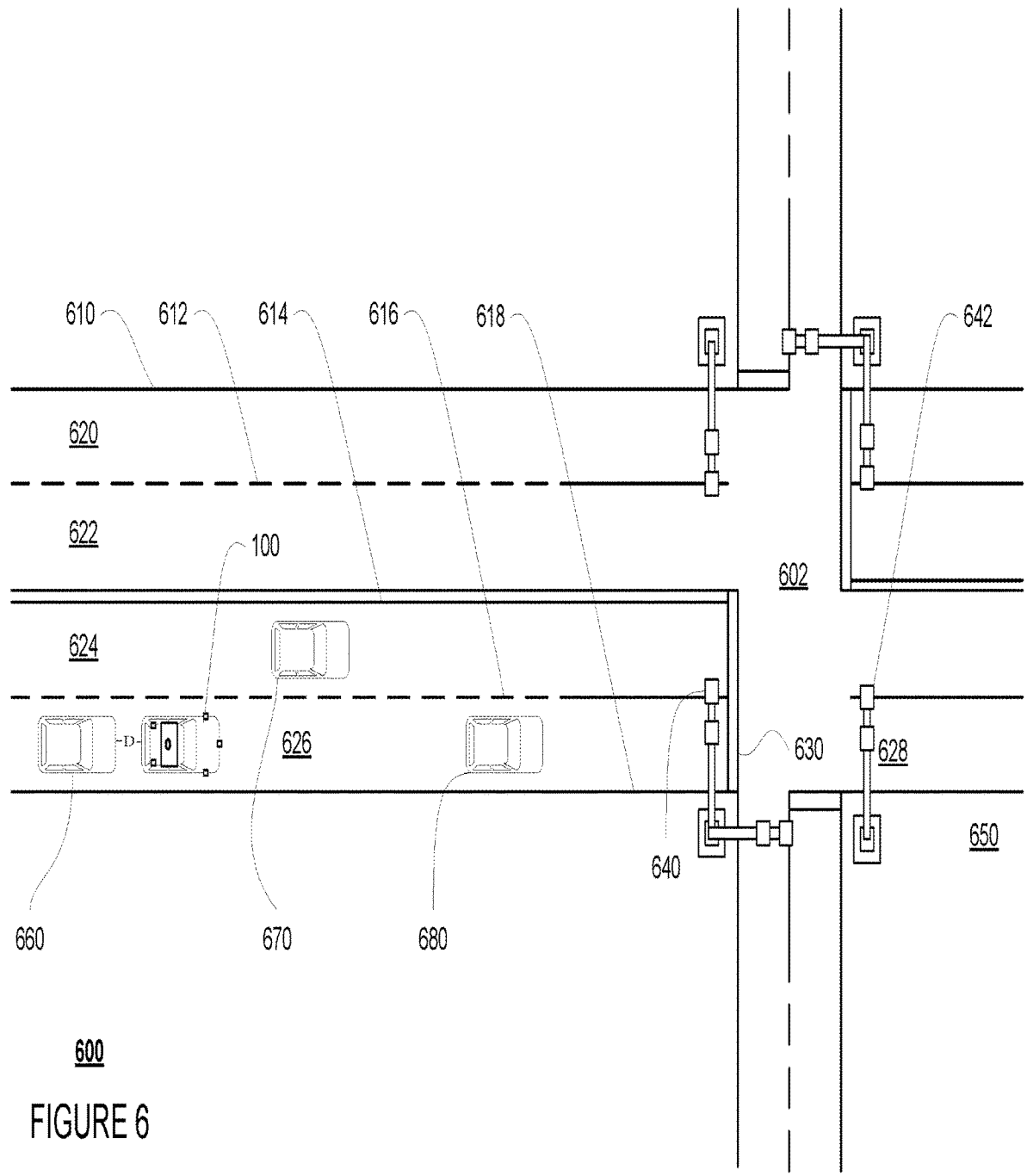
FIGS. 6-9 are an example representation of logged data in accordance with aspects of the disclosure.
Figure 7:
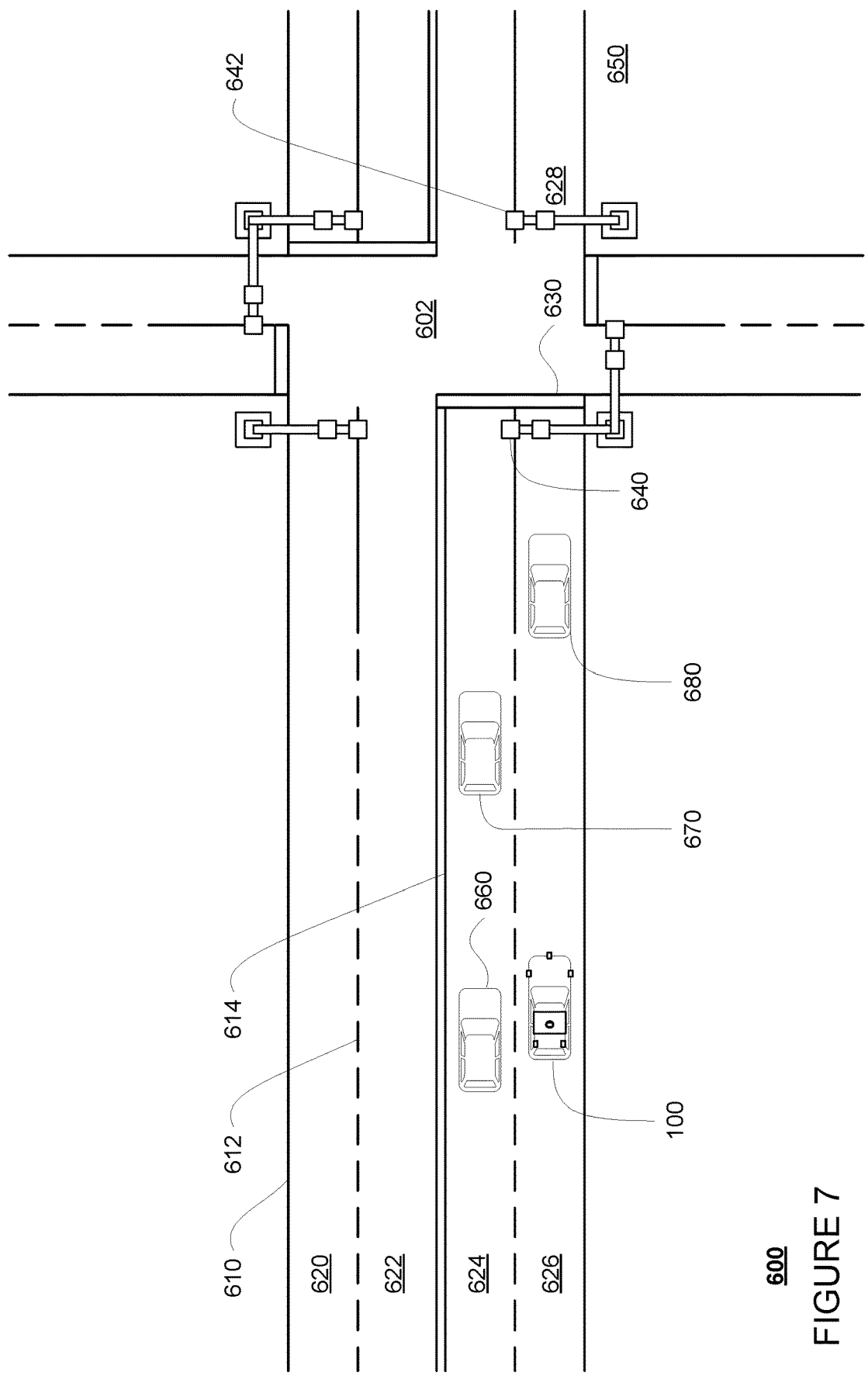
Figure 8:
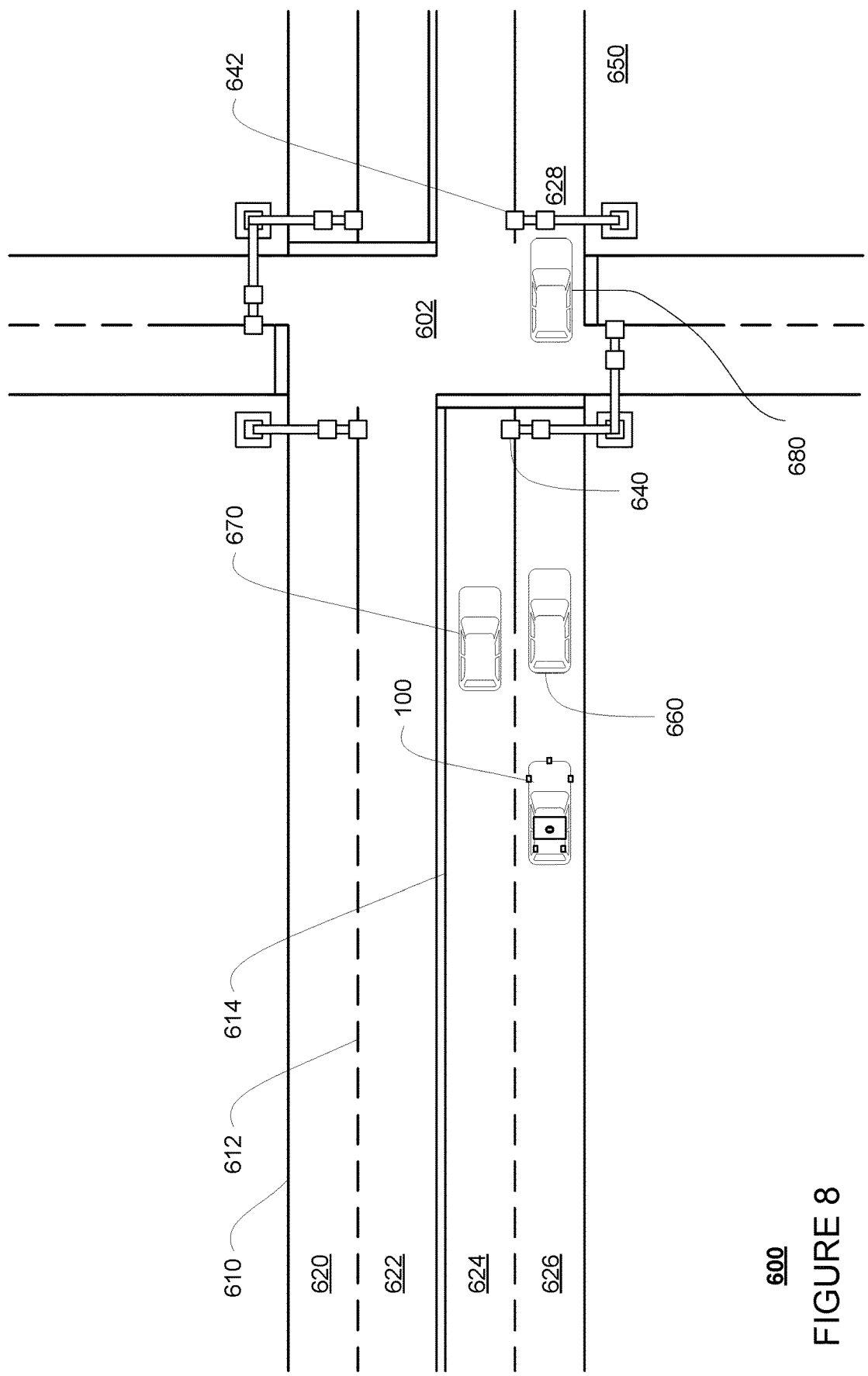
Figure 9:
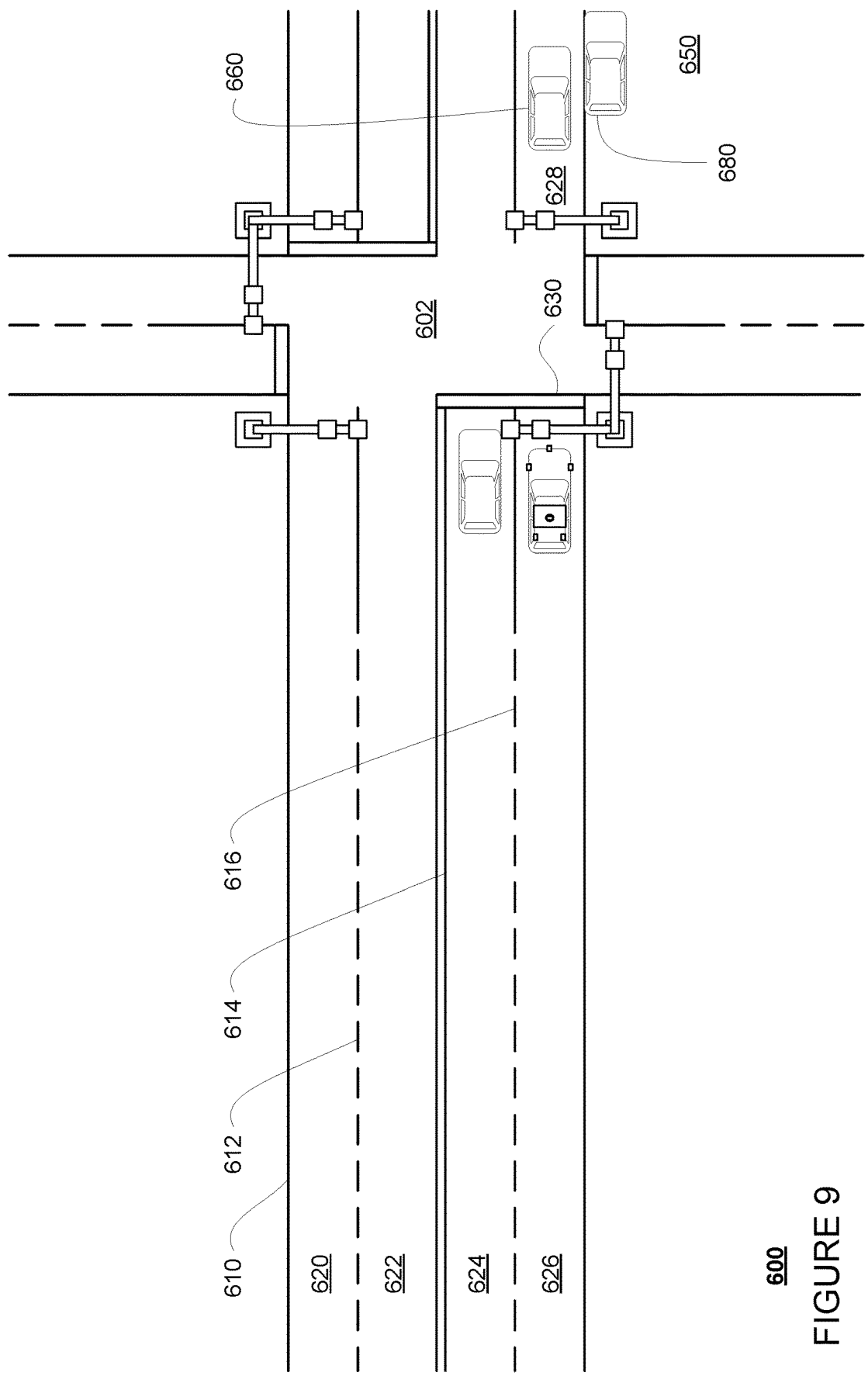

Returning to the examples of FIGS. 6-9, agent vehicle 660 initially follows vehicle 100 at a very short distance, represented by distance D in FIG. 6. This distance D may indicate that the agent vehicle 660 is an aggressive tailgater, and may be given, by the server computing devices 410, the characteristic of following other agents or a simulated vehicle at a minimum following distance equal to distance D. The agent vehicles 670 and 680 may not have any data for this signal as they are not following behind other objects, and thus may not be given, by the server computing devices 410, a characteristic for a minimum following distance based on the logged data, but rather some default value drawn from a distribution of following distance across previous logged data in similar traffic situation or an average following distance of agents across previous logged data.

Another example signal may include the overtaking intent of the agent or whether the agent intends to overtake another road user (which may or may not be the simulated vehicle) in the logged data. In this regard, if the overtaking intent of the agent is positive, the interactive agent that replaces the agent may be provided a characteristic of wanting to overtake another agent or a simulated vehicle in a simulation. If the overtaking intent of the agent is negative, the interactive agent that replaces the agent would not be provided with a characteristic of wanting to overtake another agent or a simulated vehicle in a simulation.

Returning to the examples of FIGS. 6-9, agent vehicle 660 overtakes both vehicle 100 and agent vehicle 670 in the logged data. Thus, the overtaking intent of agent vehicle 660 may be positive, and the interactive agents that replace these agent vehicles may be provided with a characteristic of wanting to overtake another agent or a simulated vehicle in a simulation. However, neither agent vehicles 670 or 680 overtake any other agents in the logged data. Thus, the overtaking intent of agent vehicles 670, 680 may be negative, and the interactive agents that replace these agent vehicles may be provided with a characteristic of not wanting to overtake another agent or a simulated vehicle in a simulation.

While the overtaking intent may be determined by observing whether the agent did over take the road user in the logged data, if not, this may only be because the logged data used for the simulation is not long enough to make an appropriate determination and thus looking at the behavior within the logged data may not be sufficient to determine the agent's actual intent. In this regard, if the logged data includes output from a behavior prediction model which provides a prediction of the agent's behavior during and possibly beyond the time period of the logged data, the overtaking intent may be determined from this predicted behavior. For example, it may be the intent of agent vehicle 670 to overtake vehicle 100 when the traffic signal light 640 turns green, though this cannot be determined from the logged data depicted in FIGS. 6-9. Thus, a behavior prediction model may be used to determine whether the agent vehicle 670 will overtake vehicle 100 when the traffic signal light 640 turns green. The interactive agent which replaces the agent vehicle 670 may be given, by the server computing devices 410, a characteristic of wanting to or not wanting to overtake another agent or a simulated vehicle in a simulation accordingly.

Another example signal may include the cut-in aggressiveness of the agent or whether the agent intends to cut-in in front of another agent or the vehicle that captured the logged data and if so, how aggressively. This may be determined, for example, by observing the logged path of the agent and an intended route of the agent predicted by a behavior prediction software module of the vehicle that captured the logged data and comparing these to determine whether there is any overlap. This may account for situations in which a safety driver disengaged the autonomous driving mode such that the actual path would not overlap. Similar calculations may be made between different agents in the logged data to determine whether there are any overlaps between the paths of those agents.

If there is overlap, the minimum braking needed so that the vehicle or the other agent can avoid a collision may be determined. This value may be calculated at different points in time during the logged data (e.g. every frame of the sensor data), and the highest (i.e. greatest amount of braking) may be used as the "minimum braking". This minimum braking may be considered a measure of cut-in aggression. For example, the greater the amount of minimum braking, the greater the cut-in aggression level and vice versa. This minimum braking may be provided as a characteristic of the interactive agent such that a simulated vehicle or other interactive agent responding to the interactive agent could be at least the minimum braking.

Returning to the examples of FIGS. 6-9, agent vehicle 660 cuts-in in front of vehicle 100 in the logged data, while agent vehicles 670, 680 do not cut-in in front of any other agents or the vehicle 100. As noted above, a cut-in aggressiveness value may also be determined from the greatest amount of braking applied by the vehicle 100 in the logged data as described above. The interactive agent which replaces the agent vehicle 670 may be given, by the server computing devices 410, a characteristic of the determined cut-in aggressiveness level. Since neither agent vehicles 670, 680 cut-in in front of another agent or vehicle 100, the interactive agents which replace these agent vehicles would not have a cut-in aggression level characteristic.

In some instances, the interactive agent may be given, by the server computing devices 410, a characteristic so that the interactive agent always assumes other road users will brake for the interactive agent at this minimum braking when such assumptions are advantageous to the interactive agent. In this regard, the interactive agent will not assume that a road user in front of the interactive agent will brake (e.g. slow down), but will assume that the road user that the interactive agent intends to cut-in in front of will brake.

Another example signal may include whether the driver intended to go off-road. Typically, interactive agents may be prevented from going off-road, but in cases where such behavior is observed in the logged data, preserving this behavior may be especially important. This may be determined, for example, by observing the logged path of the agent. If the agent did drive off-road, the interactive agent may be provided with a characteristic of being able to go off-road. If the agent did not drive off-road, the interactive agent would not be provided with a characteristic of being able to go off-road.

Returning to the examples of FIGS. 6-9, agent vehicle 680 enters into off-road area 650, while agent vehicles 660, 670 do not enter into any off-road area. In this regard, the interactive agent that replaces agent vehicle 680 may be given, by the server computing devices 410, a characteristic of being able to enter into off-road areas, while the interactive agents that replaces agent vehicles 660, 670 may be given, by the server computing devices 410, a characteristic of not being able to enter into off-road areas.

Another example signal may include the traffic light intent of the agent or whether the agent intends to run a red light. In this regard, if the traffic light intent of the agent is to run a red light, the interactive agent that replaces the agent may be provided a characteristic of being able to run red light. If the traffic light intent of the agent is not to run a red light, the interactive agent that replaces the agent may be provided a characteristic of not being able to run red light.

Returning to the examples of FIGS. 6-9, agent vehicle 660 may have run a red light, while agent vehicles 670, 680 do not run a red light. Rather, agent vehicle 670 stops at the stop line 630 and agent vehicle 680 may have a green light when entering the intersection 602. In this regard, the interactive agent that replaces agent vehicle 660 may be given, by the server computing devices 410, a characteristic of being able to run a red light, while the interactive agents that replaces agent vehicles 660, 670 may be given, by the server computing devices 410, a characteristic of not being able to run a red light.

While this may be determined by observing whether the agent did run a red light in the logged data, if not, this may only be because the logged data used for the simulation is not long enough to make an appropriate determination and thus looking at the behavior within the logged data may not be sufficient to determine the agent's actual intent. If the logged data includes output from a behavior prediction model which provides a prediction of the agent's behavior during and possibly beyond the time period of the logged data, the traffic light intent may be determined from this predicted behavior, and the interactive agent would not be provided with a characteristic of running a red light.

Another example signal may include the agent's maximum velocity and/or acceleration relative to the speed limit. This may be determined, for example, by observing the greatest velocity and greatest acceleration of the agent during the simulation. These values may be converted to maximum bounds or limits on the velocity and/or acceleration of the interactive agent during the simulation. In this example, the greatest velocity and/or accelerations of each of the agent vehicles 660, 670, 680 may be determined from the logged data and used to assign characteristics for limits on velocity and/or acceleration to the interactive agents which replace each of the agent vehicles.

In some instances, the aforementioned signals may be extracted automatically by processing the logged data using a model. For instance, a machine-learning model, decision tree, neural network, or other model may be trained to evaluate the characteristics of each agent. For example, for cut-ins human labelled data may be used as ground truth.

Returning to FIG. 10, at block 1040, the simulation is run using the logged data by replacing the agent with an interactive agent having the one or more characteristics. As noted above, for each signal determined for an agent, one or more characteristics may be identified and given, assigned, or otherwise provided, by the server computing devices 410, to an interactive agent that replaces the agent from the logged data for the simulation. This interactive agent is capable of responding to actions performed by a simulated vehicle in the simulation using software for controlling a vehicle in an autonomous driving mode. The simulation may be run using the software to control a simulated vehicle. For instance, using the identified logged data, a simulation may be run. The identified logged data may be used to run the simulation. When running the autonomous control software through the portion of logged data, the details (sensor data and events) of the logged data may be used to generate a simulation. In other words, the sensor data of the portion of logged data may simply be "played" as input to the perception system 172 of a simulated vehicle controlled by the autonomous control software. In this regard, the autonomous control software "experiences" or processes the logged data as if the autonomous control software was actually being run on vehicle 100. In other words, the simulation may include data defining characteristics of objects such as shape, location, orientation, speed, etc. of objects such as vehicles, pedestrians, bicyclists, vegetation, curbs, lane lines, sidewalks, crosswalks, buildings, etc. defined by the sensor data of the logged data. Further, the simulation may include characteristics for a virtual vehicle, corresponding to vehicle 100, including the virtual vehicle's shape, location, orientation, speed, etc. defined by the events of the logged data. However, any road users in the logged data may be replaced with interactive agents having the aforementioned identified characteristics. In this regard, each interactive agent is capable of responding to actions performed by the simulated vehicle using the software in the simulation in a way which most likely preserves the intent and persona of the agent from the logged data.

The results of the simulation may then be evaluated. For instance, the simulations may be used to determine whether a particular type of event has occurred, such as a particular type of behavior or collision. As an example, these events may be used for various purposes, such as determining whether the software can "pass" a given simulation without a collision without requiring a vehicle to physically drive "real" miles or having to "manufacture" situations in the real world.

The features described herein may provide for more accurate simulations when testing software for controlling vehicles in an autonomous driving mode. In other words, agents can be replaced with interactive agents which can respond to their environment while at the same time, preserving the scenario defined in the logged data used to run the simulation. For instance, if the logged data provides a scenario which tests an interaction with a reckless driver, the features described herein enable the preservation of the reckless behavior of the driver to be preserved. In addition, the features allow for the modeling of uncommon behavior, such as, for example, a cyclist who gets off his or her bicycle and lifts the bicycle to walk on a sidewalk.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A method of running a simulation in order to test software used to control a vehicle in an autonomous driving mode, the method comprising;
   identifying, by one or more processors, logged data for the simulation, the logged data having been collected by a first vehicle, the logged data further identifying an agent, wherein the agent is a road user;
   analyzing, by the one or more processors, the logged data to identify one or more signals of intent of the agent including a logged path of the agent, the logged path being defined by a change in pose of the agent in the logged data;
   determining, by the one or more processors, one or more characteristics based on the one or more signals; and
   running, by the one or more processors, the simulation using the logged data by replacing the agent with an interactive agent having the one or more characteristics of the agent in order to preserve the intent of the agent, wherein the interactive agent is capable of responding to actions performed by a simulated vehicle using the software in the simulation.

2. The method of claim 1, wherein the agent is a vehicle.

3. The method of claim 1, wherein the one or more characteristics includes following the logged path.

4. The method of claim 1, wherein the one or more signals of intent includes a following distance of the agent.

5. The method of claim 4, wherein the one or more characteristics is a following distance for following another agent or the simulated vehicle in the simulation.

6. The method of claim 1, wherein the one or more signals of intent includes an overtaking intent of the agent with respect to one of another agent or the first vehicle.

7. The method of claim 6, wherein the overtaking intent is determined by observing whether the agent overtook one of the another agent or the first vehicle in the logged data.

8. The method of claim 6, wherein the overtaking intent is determined from a behavior prediction for the agent during and beyond a period of the logged data.

9. The method of claim 6, wherein the one or more characteristics includes a characteristic of wanting to overtake another agent or the simulated vehicle in the simulation.

10. The method of claim 1, wherein the one or more signals of intent includes a cut-in aggressiveness of the agent with respect to the first vehicle.

11. The method of claim 10, wherein the cut-in aggressiveness of the agent is determined by comparing the logged path to a route the first vehicle was following in the logged data.

12. The method of claim 11, wherein the cut-in aggressiveness of the agent is determined based on whether the logged path overlaps with the route.

13. The method of claim 12, further comprising, when the logged path overlaps with the route, determining a minimum braking amount required for the first vehicle to avoid a collision with the agent.

14. The method of claim 13, wherein determining the one or more characteristics is further based on the minimum braking amount.

15. The method of claim 1, wherein the one or more signals of intent include an intent of the agent to go off-road.

16. The method of claim 1, wherein the one or more signals includes whether the agent intended to run a red light, and the one or more characteristics includes a characteristic of running a red light.

17. The method of claim 1, wherein the one or more signals of intent include a maximum velocity of the agent, and the one or more characteristics includes the maximum velocity as a limit on a velocity of the interactive agent.

18. The method of claim 1, wherein the one or more signals of intent include the maximum acceleration of the agent, and the one or more characteristics includes the maximum acceleration as a limit on acceleration of the interactive agent.

19. The method of claim 1, further comprising:
evaluating results of running the simulation; and
flagging the simulation for review based on the evaluation.

* * * * *